United States Patent [19]

Shimoji

[11] Patent Number: 5,420,458
[45] Date of Patent: May 30, 1995

[54] SEMICONDUCTOR DEVICE AND METHOD OF MANUFACTURE THEREOF

[75] Inventor: Noriyuki Shimoji, Kyoto, Japan
[73] Assignee: Rohm Co., Ltd., Kyoto, Japan
[21] Appl. No.: 310,011
[22] Filed: Sep. 21, 1994

Related U.S. Application Data

[63] Continuation of Ser. No. 863,265, Apr. 3, 1992, abandoned.

[30] Foreign Application Priority Data

Oct. 30, 1991 [JP] Japan .................. 3-284998

[51] Int. Cl.$^6$ .............. H01L 29/68; H01L 27/12; H01L 27/04; H01L 29/06
[52] U.S. Cl. ..................... 257/622; 257/296; 257/506; 257/524; 257/619
[58] Field of Search ............ 257/296, 619, 622, 506, 257/524

[56] References Cited

U.S. PATENT DOCUMENTS

| | | | |
|---|---|---|---|
| 3,746,587 | 7/1993 | Roswold | 257/619 |
| 3,777,227 | 12/1973 | Krishna et al. | 317/235 R |
| 4,505,799 | 3/1985 | Baxter | 204/416 |
| 4,949,138 | 8/1990 | Nishimura | 357/23.6 |
| 4,954,927 | 9/1990 | Park | 361/328 |
| 4,990,986 | 2/1991 | Murokami et al. | 257/622 |
| 5,122,856 | 6/1992 | Komiya | 257/622 |

Primary Examiner—Rolf Hille
Assistant Examiner—Valencia Martin Wallace
Attorney, Agent, or Firm—Lowe, Price, LeBlanc & Becker

[57] ABSTRACT

A semiconductor device having a high-speed device and a uniform plane bearing is provided. Device formation regions (51, 52, and 55) are formed on upper surfaces of the silicon substrate (21 and 22), and device isolation regions (9) acting as insulating layer are formed therebetween. The silicon substrate is etched to shape a bottom recessed part (8). The bottom recessed part (8) is formed in such a manner that it borders on the device isolation region (9) and allows the device formation regions (51, 52, and 55) to be emerged therefrom. This structure enables a pn junction to be eliminated, realizing a semiconductor device capable of high-speed operation. Further, each device is formed in an N$^-$ type silicon layer (22) which is grown from the silicon substrate, and thereafter is insulated by forming the bottom recessed part (8). Accordingly, the semiconductor device has a uniform plane bearing.

6 Claims, 6 Drawing Sheets

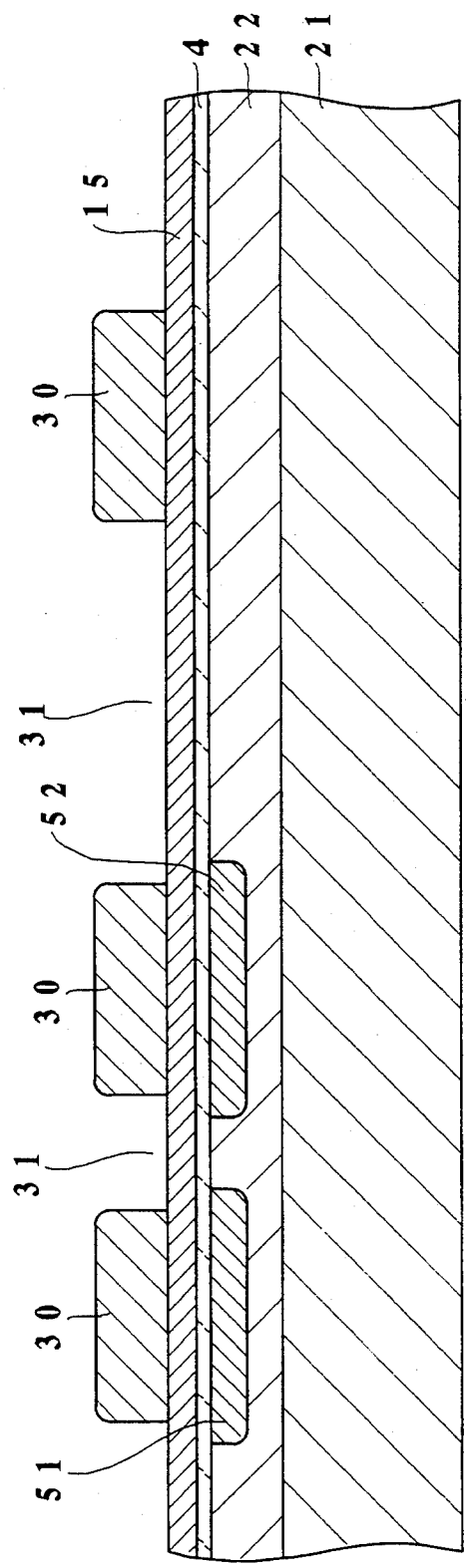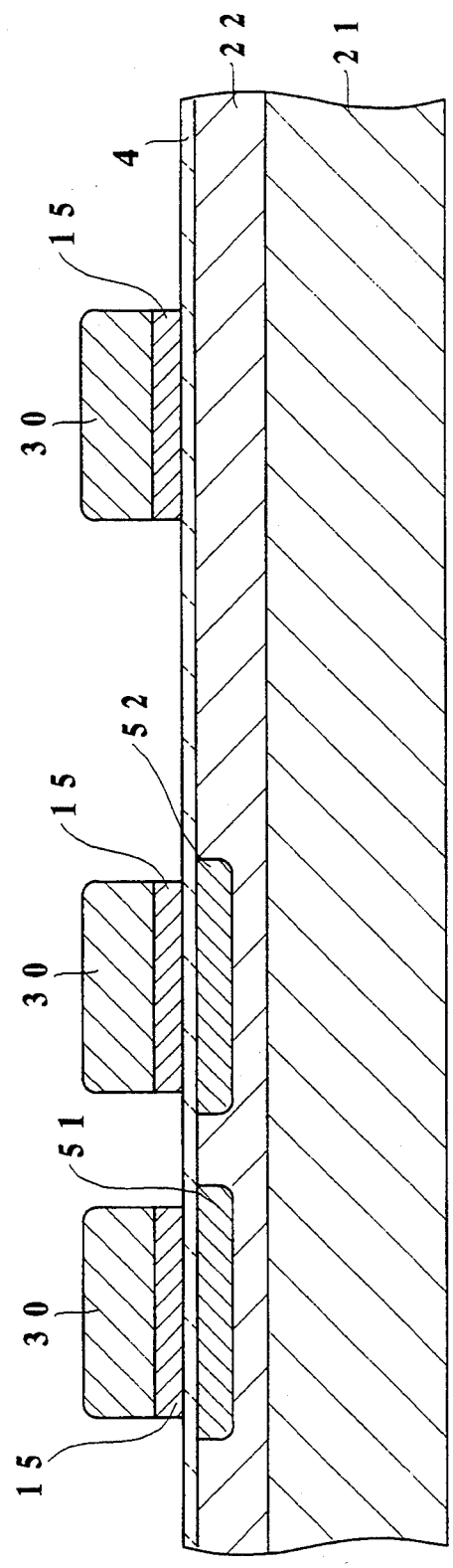

SEMICONDUCTOR DEVICE AND METHOD OF MANUFACTURE THEREOF

This application is a continuation of application Ser. No. 07/863,265 filed Apr. 3, 1992, now abandoned.

BACKGROUND OF THE INVENTION

1. Field of the Invention

The present invention relates to a semiconductor device and a method of manufacture thereof and, more particularly, to a technique to provide a semiconductor device having a high-speed device and a uniform plane bearing.

2. Description of the Prior Art

In integrated circuits in general, an epitaxially grown layer is grown on a silicon substrate, and circuits are then formed in the epitaxially grown layer. For example, an N type silicon substrate is first formed and then a P type epitaxially grown layer is grown thereon so as to allow desired circuits to be formed therein.

In such a structure, however, the silicon substrate and the epitaxially grown layer are so constructed as to join together, so that a pn junction is occurred in their interface area. The pn junction thus formed is such that it acts as capacitor and yields parasitic capacitance. As a result of the parasitic capacitance of the pn junction, an operating speed of the resulting device is made to reduce.

In the last few years, to solve this problem, a way of forming an additional silicon monocrystal layer to overlie the insulating layer on the silicon substrate (Semiconductor on Insulator, or SOI, technique) has been sought. This is to lay an insulating layer between the silicon substrate and the silicon monocrystal layer to thereby insulate them from each other and eliminate the pn junction. This SOI technique will be concretely described hereinbelow.

FIGS. 1A and 1B illustrates the conventional SOI technique using the ELO (Epitaxial Lateral Overgrowth) method as described in "Lateral Epitaxial Overgrowth of Silicon on $SiO_2$," by D. D. Rathman et. al., JOURNAL OF ELECTRO-CHEMICAL SOCIETY SOLID-STATE SCIENCE AND TECHNOLOGY, October, 1982, p. 2303. In this ELO method, a silicon dioxide layer 41 which acts as insulating layer is grown on a semiconductor substrate 2, and thereafter subjected to etching using photoresist so as to open seed windows 61 (FIG. 1A).

Next, epitaxial growth of silicon is performed from the seed window 61 in the longitudinal direction, and subsequently in the lateral direction. By these processes, an epitaxial layer 81 is formed on the silicon dioxide layer 41 acting as insulating layer (FIG. 1B). In the obtained structure, the silicon dioxide layer 41 serves to reduces the interface area of the epitaxial layer 81 with the silicon substrate 2 down to the size of the seed window 61. Accordingly, the parasitic capacitance due to the pn junction is reduced, allowing high-speed operation of the device to be realized.

Another conventional method available is the SENTAXY method shown in FIGS. 1C and 1D ("New SOI-Selective Nucleation Epitaxy," by Ryudai Yonehara et. al., Preliminary Bulletin for the 48th Fall Academic Lecture 1987 by the Applied Physics Society, 19p-Q-15, p. 583). In this method, an insulating layer of silicon dioxide 42 is formed on a silicon substrate 2 and a plurality of silicon nuclei 82 for use in crystal growth are attached thereto (FIG. 1C). Here, silicon nuclei 82 are separately placed on the silicon dioxide layer 42.

Silicon nuclei 82 are then subjected to epitaxial growth (FIG. 1D). By using this method, the silicon substrate 2 and the epitaxial layer 83 can be fully isolated from one another by the existence of the dioxide layer 42. Accordingly, the pn junction is eliminated, allowing the parasitic capacitance to be avoided. Methods of forming the nuclei include formation of a small-area silicon nitride layer, or employment of the FIB (Focused Ion Beam) method.

However, the conventional SOI technique described above has the following disadvantages. First, in the ELO method shown in FIGS. 1A and 1B, the pn junction of the epitaxial layer 81 and the silicon substrate 2, although reduced to the size of the seed window 61 (FIG. 1B), is not fully eliminated. As a result, parasitic capacitance is allowed to generate to that extent and arrests further increase of the operating speed of the device.

Second, in the SENTAXY method shown in FIGS. 1C and 1D, the epitaxial layer 83 and the silicon substrate 2 are fully isolated from one another, thus overcoming the ELO method disadvantage. However, in the SENTAXY method, epitaxial growth is performed on the basis of silicon nuclei 82 which are placed on the silicon dioxide layer 42 and are not in contact with the silicon substrate 2.

Consequently, silicon substrate 2 and the epitaxial layer 83 are not formed connectively, and so, inconsistent in the plane bearing. In other words, the ELO method shown in FIGS. 1A and 1B allows the uniform plane bearing because the epitaxial layer is grown on the basis of the silicon substrate 2, whereas the SENTAXY method shown in FIGS. 1C and 1D gives inconsistent plane bearings. The differentiation in plane bearing is responsible for variation in oxidation rate, ion diffusion rate, and other characteristics, with the result that a device having desired electrical characteristics cannot be uniformly formed.

SUMMARY OF THE INVENTION

An object of the present invention is to provide a semiconductor device which has a high-speed device and a uniform plane bearing.

According to a feature of the invention, there is provided a semiconductor device comprising:

a semiconductor substrate having a bottom recessed part;

a device formation region which is formed on an upper surface of the semiconductor substrate in such a manner as to be emerged from the bottom recessed part; and a surface insulating layer which is formed on the upper surface of the semiconductor substrate in such a manner as to be emerged from the bottom recessed part, being so situated as to border on the device formation region, insulating the device formation region from the semiconductor substrate.

According to a further feature of the invention, there is provided a method for manufacturing a semiconductor device comprising the steps of:

forming a device formation region on an upper surface of the semiconductor substrate in such a manner as to be emerged from the bottom recessed part; and forming a surface insulating layer on the surface of the semiconductor substrate in such a manner that surface insulating layer is emerged from the bottom recessed part and is so situated as to border on the device formation region, whereby the device formation region is insulated from the semiconductor substrate.

While the novel features of the invention are set forth in a general fashion, particularly in the appended claims, the invention, both as to organization and content, will be better understood and appreciated, along with other objects and features thereof, from the following detailed description taken in conjunction with the drawings.

BRIEF DESCRIPTION OF THE DRAWINGS

FIGS. 4A and 4B are cross-sectional views illustrating further steps in a manufacturing method of a semiconductor device according to an embodiment of the present invention.

DESCRIPTION OF THE PREFERRED EMBODIMENT

Figure 2:
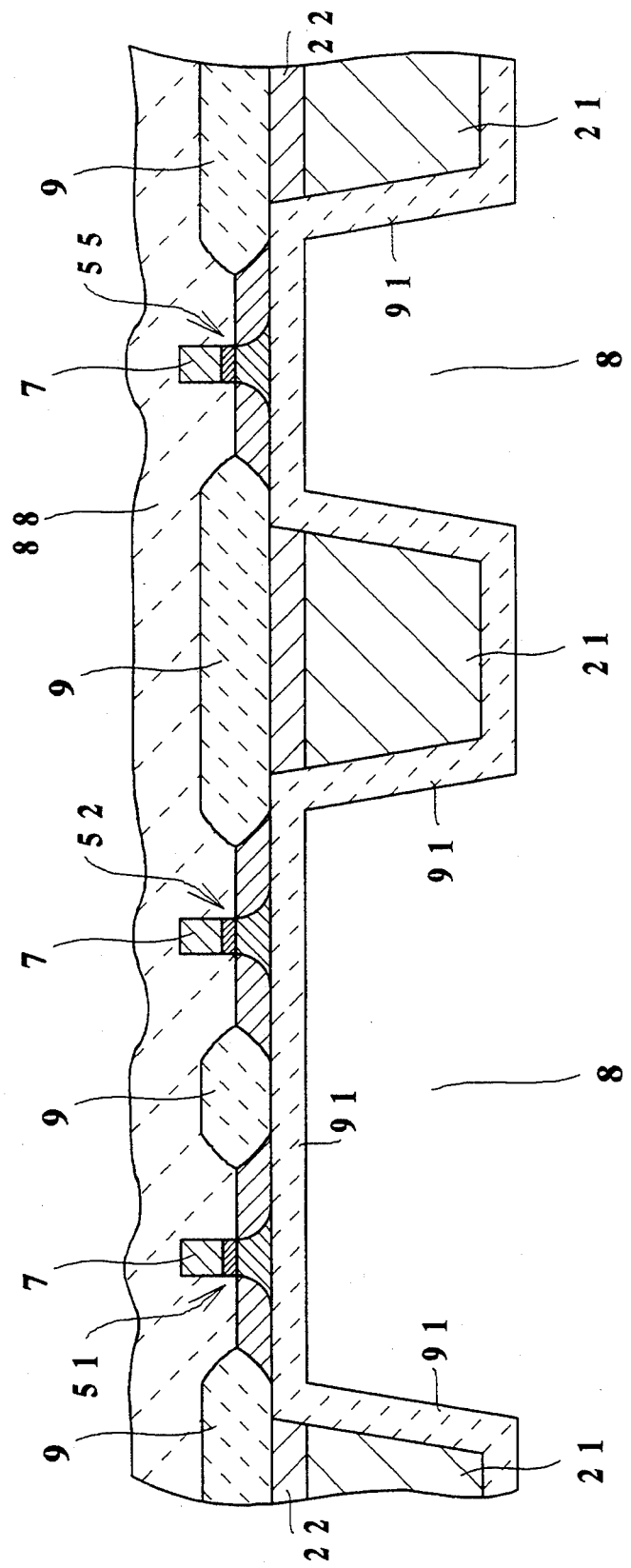
FIG. 2 is a cross-sectional view illustrating a semiconductor device according to an embodiment of the present invention.

A semiconductor device and a manufacturing method thereof according to an embodiment of the present invention will be described below. FIG. 2 shows a cross-sectional view of a semiconductor device. FIGS. 3A-3C, FIGS. 4A and 4B, FIGS. 5A and 5B, and FIGS. 6A and 6B show detailed steps in a manufacturing method of a semiconductor device of FIG. 2.

Figure 3A:
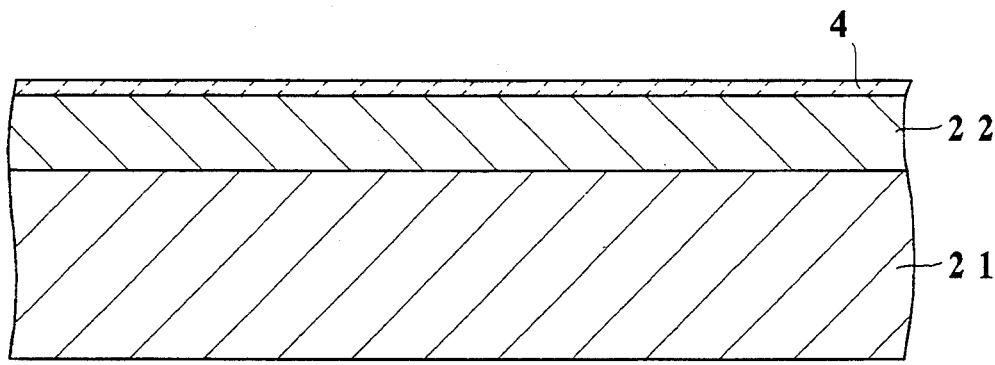
FIGS. 3A-3C are cross sectional views illustrating steps in a manufacturing method of a semiconductor device according to an embodiment of the present invention.
Figure 3B:
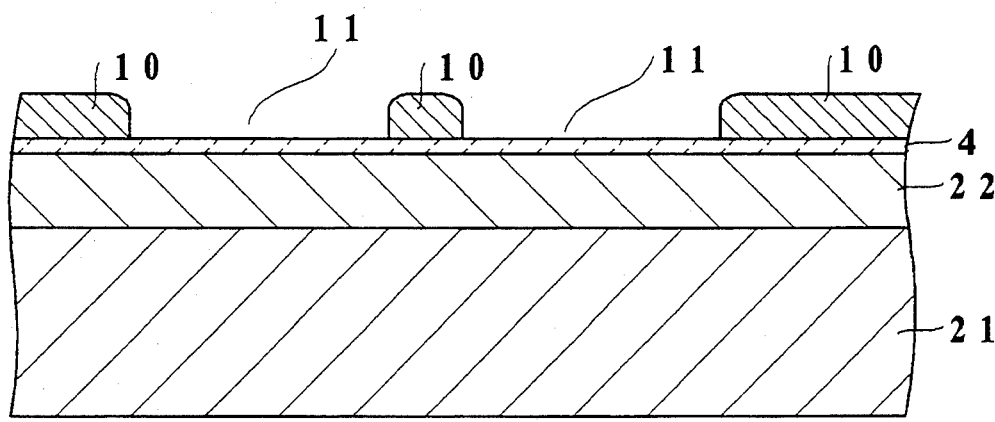
Figure 3C:
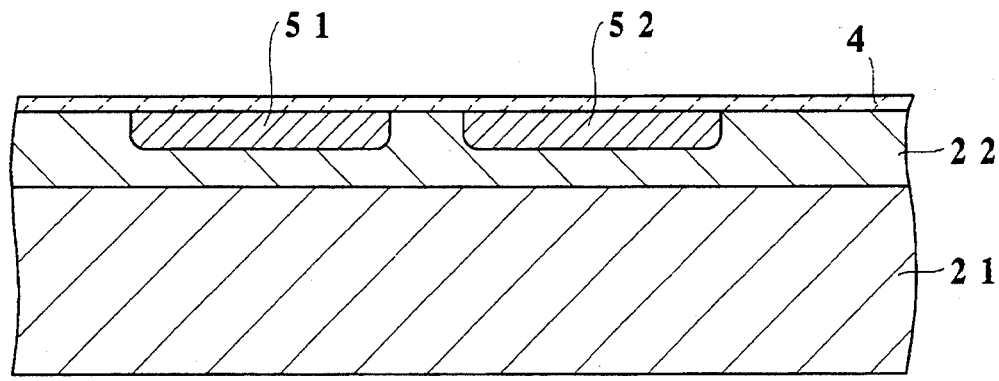

First, an N⁻ type silicon layer 22 is formed on an N+ type silicon substrate 21, as shown in FIG. 3A. Then, the silicon substrate is placed in a high temperature of oxygen atmosphere, to thereby grow a silicon dioxide layer 4. Next, using photoetching technique (photoresist), pattern formation is carried out on the silicon dioxide layer 4 (FIG. 3B) so as to allow a P type region to be formed in the N⁻ type silicon layer 22. In other words, an opening 11 for use in forming the P type region is produced with the aid of photoresist 10.

Further, the N⁻ type silicon layer 22 is converted into P type by implanting boron ions or the like from the opening 11. The ion implantation is performed using the photoresist 10 on the silicon dioxide layer 4 as a mask, wherein the photoresist 10 blocks boron ions, so that the implantation is performed only through the opening 11. Then, the photoresist 10 is removed, and thereafter implanted boron ions are subjected to thermal diffusion. As a result, a first device formation region 51 and a second device formation region 52, which equally classified as a P type, are formed as shown in FIG. 2C.

Figure 5A:
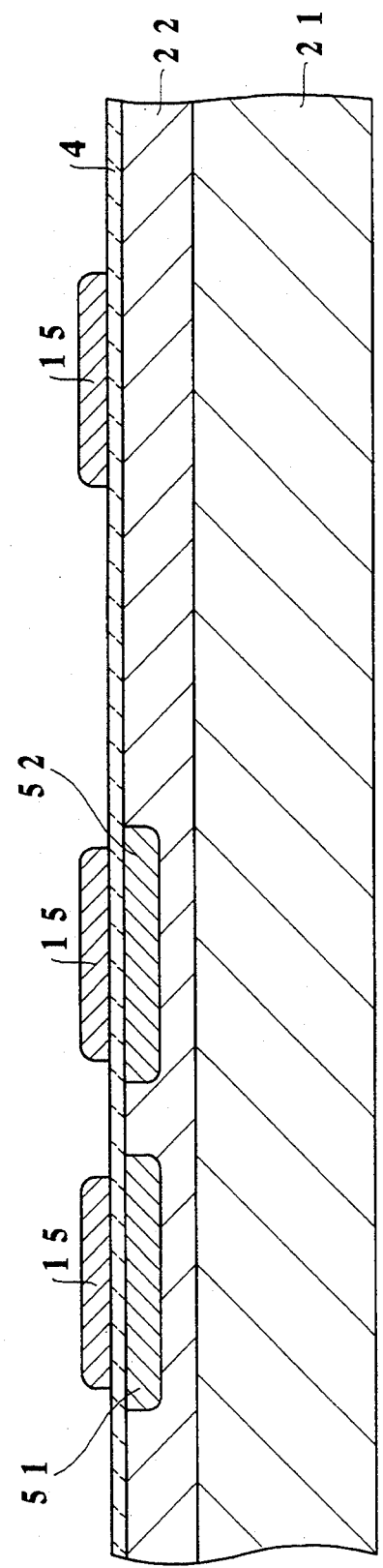
FIGS. 5A and 5B are cross-sectional views illustrating still further steps in a manufacturing method of a semiconductor device according to an embodiment of the present invention.
Figure 5B:
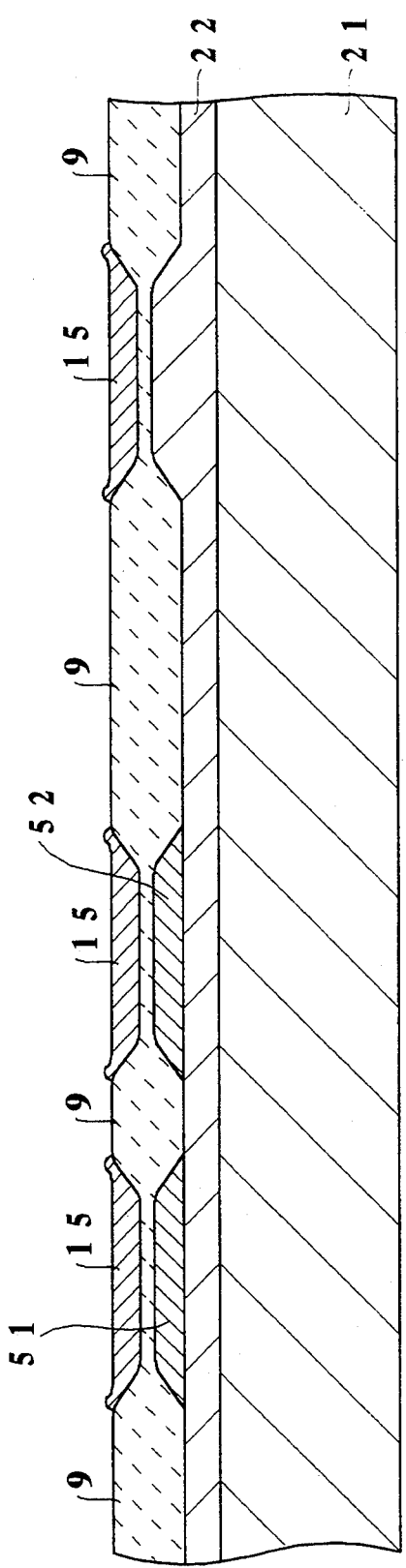

The following steps are, using the LOCUS method, to produce device isolation regions 9 or surface insulating layer. A method for forming the device isolation regions 9 will be described hereinafter. A silicon nitride layer 15 is first formed on the silicon dioxide layer 4, and is applied by photoresist 30. The photoresist 30 is provided with openings 31 for use in etching the silicon nitride layer 15 in order that the device isolation regions 9 are patterned (FIG. 4A). The silicon nitride layer 15 is then chemically etched from the openings 31 (FIG. 4B), and thereafter the photoresist 30 is removed (FIG. 5A). In the state of FIG. 5A, heat treatment is effected, with temperature increased to high, to thereby expand the silicon dioxide layer 4. Since the silicon nitride layer 15 is not subject to oxidation, the silicon dioxide layer 4 situated directly under the silicon nitride layer 15 remains unchanged, whereas the silicon dioxide layer 4 which is patterned by the silicon nitride layer 15 is made to expand, as shown in FIG. 5B. Here, the expanded silicon dioxide layer 4 is referred to as a device isolation region 9 or a surface insulating layer.

Figure 6A:
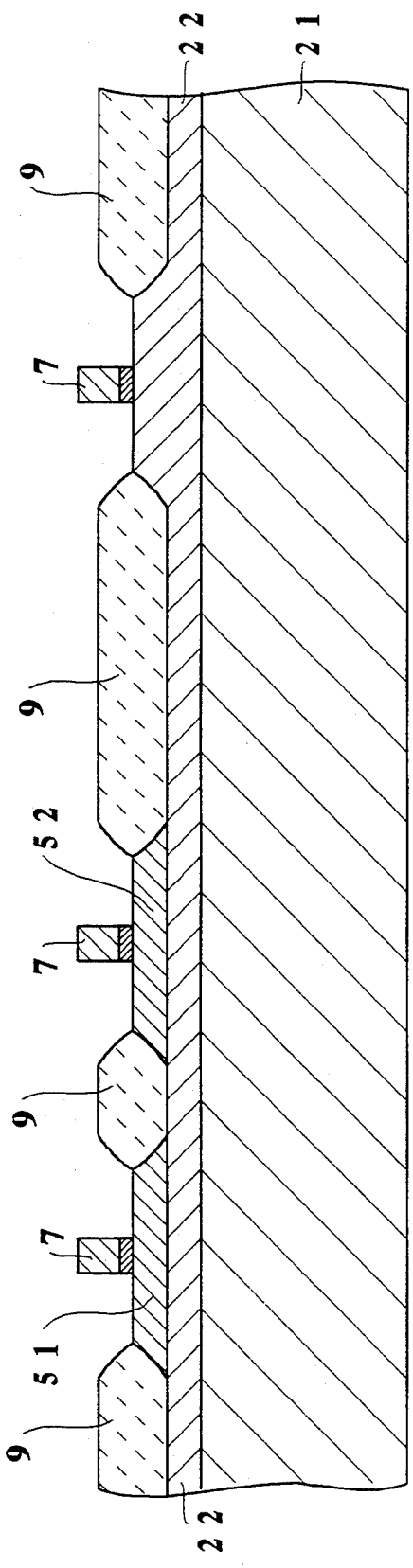
FIGS. 6A and 6B are cross-sectional views illustrating yet further steps in manufacturing method of a semiconductor device according to an embodiment of the present invention.

Furthermore, the silicon nitride layer 15 and the silicon dioxide layer 4 thereunder are etched to remove, and thereafter a gate electrode 7 is attached, as shown in FIG. 6A. The gate electrode 7 is produced as follows. A silicon dioxide layer is reconstructed in the area where the preceding silicon dioxide layer 4 is etched to remove, and subsequently, a polysilicon layer is grown thereon. Using photoresist, etching is carried out so as to form the gate electrode 7.

This is followed by devices formation, by which a first device formation region 51, a second device formation 52 or the like are formed on desired places. For that purpose, ion implantation is performed, wherein boron ions and arsenic ions are implanted into the N type region and the P type region, respectively. These ions are then diffused, forming a P type device and an N type device in each region. In this embodiment, the first device formation region 51 and the second device formation region 52 are arranged as the P type region, so that implanted arsenic ions serve to form the N type devices 71. On the other hand, boron ions, implanted into the N type region, form the P type device 72. Incidentally, the device formation region 55 is produced near the P type device 72. Also, the device isolation region 9 which is formed between the first device formation region 51 and the second device formation region 52 is referred to as an intermediate insulating layer in the present invention.

Figure 6B:
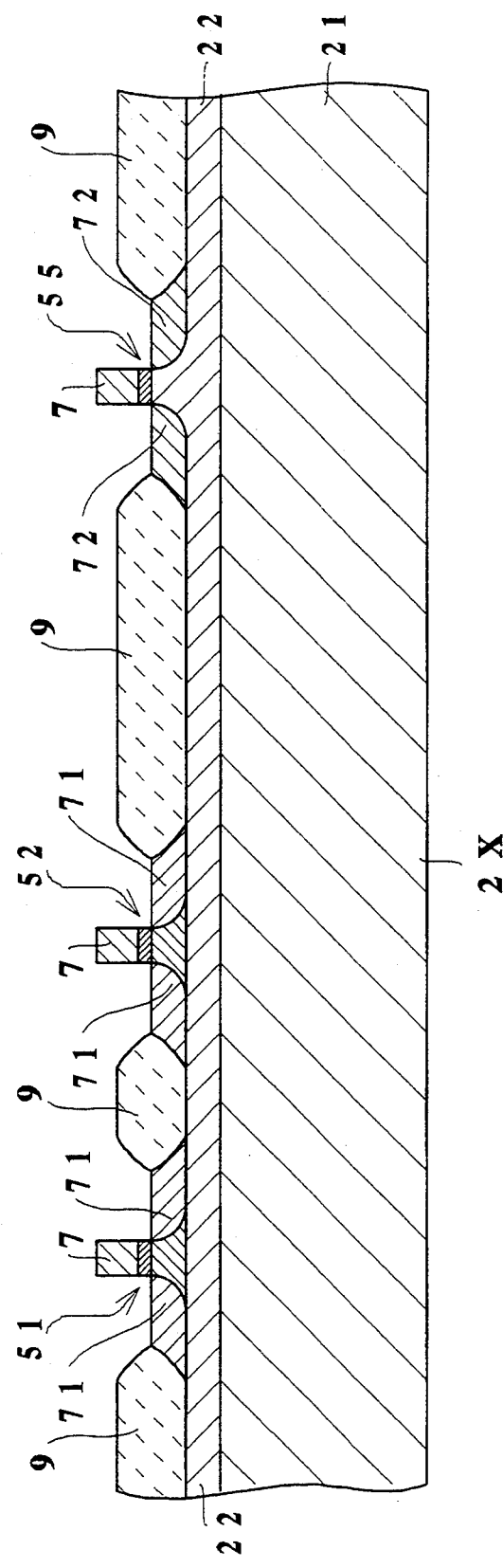

In the resulting silicon substrate shown in FIG. 6B, an underside thereof 2X (FIG. 6) is etched to form bottom recessed parts 8 of the semiconductor device, as shown in FIG. 2. The bottom recessed part 8 is formed in such a manner that it borders on the device isolation region 9, and allows the first device formation region 51, the second device formation region 52 and the device formation region 55 to be emerged therefrom.

The etching described above is carried out by the use of such an alkaline solution as a KOH solution, or a mixed solution of hydrofluoric acid and nitric acid. Using these solutions permit etching treatment to be stopped at the desired position. This is because the etching speed varies depending on impurity density contained in the silicon substrate. This means that the etching treatment can be stopped whenever it reaches device isolation regions, or each device formation regions. In addition, the bottom recessed part 8 is provided with an oxide layer 91. This oxide layer 91 acts as protector against contaminant or the like, giving a sufficient strength to the semiconductor device. Also, all of the upper surface is covered with a protective layer 88.

In the device whose bottom recessed part 8 is formed as shown in FIG. 2, the N⁻ type silicon layer 22 is fully insulated from the first device formation region 51, the second device formation region 52, and the device formation region 55. This structure allows the pn junction capacitance to be eliminated and high-speed operation of the semiconductor device to be realized. It is also realized to insulate the first device formation region 51 and the second device formation region 52 from each other by forming a single bottom recessed part 8.

Figure 1A:
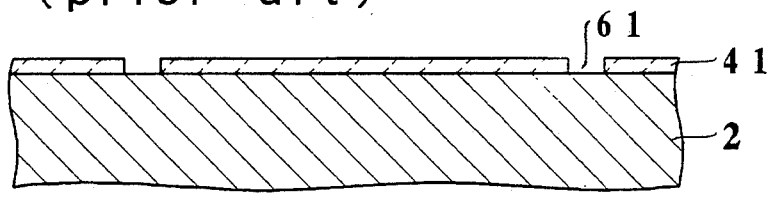
FIGS. 1A-1D are cross-sectional views illustrating steps in manufacturing methods of conventional semiconductor devices.
Figure 1B:
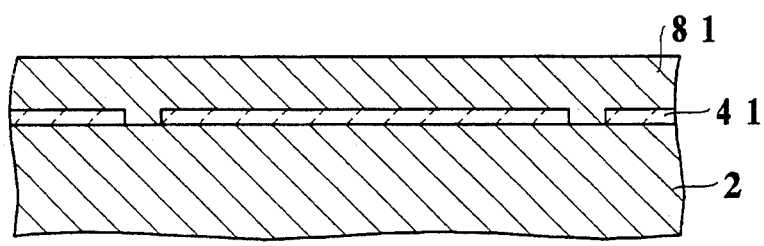
Figure 1C:
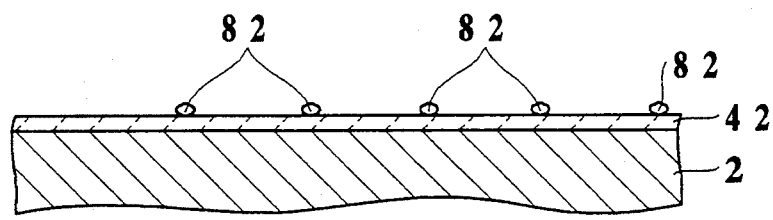
Figure 1D:
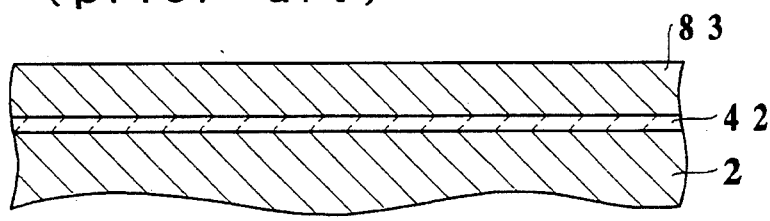

Further, a semiconductor device having a uniform plane bearing can be obtained, since each device is formed in the N⁻ type silicon layer 22 and thereafter is insulated by the bottom recessed part 8. For that reason, the present invention overcomes the disadvantage involved in SENTAXY method, which does not allow the silicon substrate 2 and the epitaxially grown layer 83 to be formed connectively, and so the plane bearing of the device is inconsistent, as shown in FIG. 1C and 1D.

And still further, the present invention does not allow the silicon substrate to be formed thin throughout, but partly forms the bottom recessed parts 8 so as to leave the unetched N⁺ type silicon substrate 21 except for the bottom recessed parts 8. The resulting semiconductor device, therefore, has a sufficient strength and an excellent durability.

In the semiconductor device and the manufacturing method thereof according to the present invention, the semiconductor substrate and the device formation region are so formed as to be fully insulated from one another. As a result, the semiconductor device has no parasitic capacitance due to a pn junction, realizing high-speed operation.

Further, the device formation regions are connectively formed on the upper surface of the semiconductor substrate and insulated by the presence of the bottom recessed part. Therefore, the device formation regions and the silicon substrate hold the same crystallinity, realizing the semiconductor device having the uniform plane bearing.

Moreover, the semiconductor substrate, in which the bottom recessed part is partly formed, does not allow to be formed thin throughout, so that it holds a sufficient strength. Consequently, the resulting semiconductor device has an excellent durability and a high reliability.

In the semiconductor device of the present invention, the first device formation region and the second device formation region can be formed as separate regions. Therefore, the first device formation region and the second device formation region are insulated from one another, enabling the parasitic capacitance to be further suppressed and high-speed operation to be realized more certainly.

Although the invention has been described in its preferred form with a certain degree of particularity, it is understood that the present disclosure of the preferred form has been changed in the details of its construction and any combination and arrangement of parts may be resorted to without departing from the spirit and the scope of the invention as hereinafter claimed.

What is claimed is:
1. A semiconductor device, comprising:
   a semiconductor substrate having an upper surface and a bottom surface;
   a recessed portion formed in the bottom surface of the semiconductor substrate;
   a semiconductor layer formed on said upper surface of the semiconductor substrate;
   a device formation region formed above the upper surface of the semiconductor substrate, said device formation region being positioned above the recessed portion formed in the bottom surface of the semiconductor substrate; and
   an isolation region formed above the upper surface of the semiconductor substrate, said isolation region being positioned over at least a portion of the recessed portion formed in the bottom surface of the semiconductor substrate and forming a border with said device formation region which surrounds the device formation region, said isolation region insulating the device formation region from the semiconductor layer.

2. The semiconductor device as claimed in claim 1 further comprising an intermediate insulating layer formed in said device formation region and above the recessed portion to divide said device formation region into first and second device formation regions.

3. The semiconductor device as claimed in claim 1 wherein said bottom surface of said semiconductor substrate has an oxide layer thereon.

4. A semiconductor device as claimed in claim 1, wherein said bottom recessed part is etched to shaped by the use of an etching solution, whose etching speed varies depending on impurity density in the silicon substrate.

5. A semiconductor device as claimed in claim 4, wherein said etching solution is a potassium hydroxide solution.

6. A semiconductor device as claimed in claim 4, wherein said etching solution is a mixed solution of hydrofluoric acid and nitric acid.

* * * * *